(12) United States Patent
Tseng et al.

(10) Patent No.: US 8,502,335 B2
(45) Date of Patent: Aug. 6, 2013

(54) CMOS IMAGE SENSOR BIG VIA BONDING PAD APPLICATION FOR ALCU PROCESS

(75) Inventors: Uway Tseng, Tai-Zhong County (TW); Lin-June Wu, Hsin-Chu (TW); Yu-Ting Lin, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 563 days.

(21) Appl. No.: 12/616,652

(22) Filed: Nov. 11, 2009

(65) Prior Publication Data

US 2011/0024867 A1    Feb. 3, 2011

Related U.S. Application Data

(63) Continuation-in-part of application No. 12/511,789, filed on Jul. 29, 2009.

(51) Int. Cl.
*H01L 31/00* (2006.01)

(52) U.S. Cl.
USPC .............. 257/460; 257/447; 257/E31.127

(58) Field of Classification Search
USPC .................... 257/447, 460, E31.127
See application file for complete search history.

(56) References Cited

U.S. PATENT DOCUMENTS

| 7,101,726 B2 * | 9/2006 | Yamamoto et al. ............ 438/69 |
| 7,859,033 B2 | 12/2010 | Brady |
| 2009/0032893 A1 | 2/2009 | Weng et al. |

FOREIGN PATENT DOCUMENTS

| JP | 11340319 | 12/1999 |
| JP | 2005/191492 | 7/2005 |
| JP | 2006/253422 | 9/2006 |
| TW | 2006/42036 | 4/1995 |
| TW | 452930 | 9/2001 |
| TW | 2008/27248 | 7/2008 |

OTHER PUBLICATIONS

Semiconductor Glossary definition of "Multilevel Interconnect", printed from http://www.semi1source.com/glossary/default.asp?searchterm=interconnect on Mar. 1, 2013.*
Taiwanese Patent Office, Office Action dated Dec. 17, 2012, Application No. 10121422630, 10 pages.
Japanese Patent Office, Office Action dated Dec. 25, 2012, Application No. 2010-170162, 3 pages.

* cited by examiner

*Primary Examiner* — Steven J Fulk
(74) *Attorney, Agent, or Firm* — Haynes and Boone, LLP

(57) ABSTRACT

An integrated circuit includes a substrate having a bonding pad region and a non-bonding pad region. A relatively large via, called a "big via," is formed on the substrate in the bonding region. The big via has a first dimension in a top view toward the substrate. The integrated circuit also includes a plurality of vias formed on the substrate in the non-bonding region. The plurality of vias each have a second dimension in the top view, the second dimension being substantially less than the first dimension.

20 Claims, 13 Drawing Sheets

CMOS IMAGE SENSOR BIG VIA BONDING PAD APPLICATION FOR ALCU PROCESS

PRIORITY DATA

This application is a continuation-in-part of Non-Provisional application Ser. No. 12/511,789 filed on Jul. 29, 2009, entitled "CMOS IMAGE SENSOR BIG VIA BONDING PAD APPLICATION FOR AlCu PROCESS," the entire disclosure of which is incorporated herein by reference.

BACKGROUND

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed. In the course of IC evolution, functional density (i.e., the number of interconnected devices per chip area) has generally increased while geometry size (i.e., the smallest component that can be created using a fabrication process) has decreased.

Pads used for various applications, such as probe and/or wire bonding (generally referred to hereafter as a bonding pad) often have separate requirements than other features of an IC. For example, a bonding pad must have sufficient size and strength to withstand physical contact due to such actions as probing or wire bonding. There is often a simultaneous desire to make features relatively small (both in size and in thickness). For example, in applications such as a complementary metal-oxide semiconductor (CMOS) image sensor, it is often desired to have one or more relatively thin metal layers, for example a metal layer of aluminum copper (AlCu). A problem with thin metal layers is that the bond pads formed in these layers can exhibit peeling or other defects. A need therefore exists to accommodate the various requirements of these features.

SUMMARY

The present disclosure provides many different embodiments of the present invention. In one embodiment, the present disclosure describes an integrated circuit, including a substrate having a bonding pad region and a non-bonding pad region. A relatively large via, called a "big via," is formed on the substrate in the bonding region. The big via has a first dimension in a top view toward the substrate. In one embodiment, the first dimension is between about 30 micrometer and about 200 micrometer. The integrated circuit also includes a plurality of vias formed on the substrate in the non-bonding region. The plurality of vias each have a second dimension in the top view, the second dimension being substantially less than the first dimension. In one embodiment, the second dimension is between about 0.1 micrometer and about 0.5 micrometer.

In another embodiment, the present disclosure describes a backside illuminated image (BSI) sensor including a substrate having a bonding region and a non-bonding region and having a front side and a backside. A first conductive line is on the front side of the substrate in the bonding region and a second conductive line is on the front side of the substrate in the non-bonding region. The BSI sensor includes a first via having a first diameter over the first conductive line and a second via having a second diameter over the second conductive line. The first diameter is substantially greater than the second diameter. The substrate can thereby be bonded to the front side of the substrate.

In another embodiment, the present disclosure describes a front side illuminated image (FSI) sensor including a substrate having a bonding region and a non-bonding region and having a front side and a backside. A first conductive line is on the front side of the substrate in the bonding region and a second conductive line is on the front side of the substrate in the non-bonding region. The FSI sensor includes a first via having a first diameter over the first conductive line and a second via having a second diameter over the second conductive line. The first diameter is substantially greater than the second diameter. The FSI sensor includes a third conductive line formed over the first via and adapted for receiving a bonding wire.

In another embodiment, a method of fabricating a semiconductor device is disclosed. The method includes providing a substrate and forming first and second conductive lines over the substrate. The first and second conductive lines are formed in a bonding pad region and a non-bonding pad region of the semiconductor device, respectively. A first via having a first width is formed over the first conductive line and a second via having a second width is formed over the second conductive line. The first width is substantially greater than about 2 um per side of the second width. The method further includes forming a third conductive line over the first via.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1:
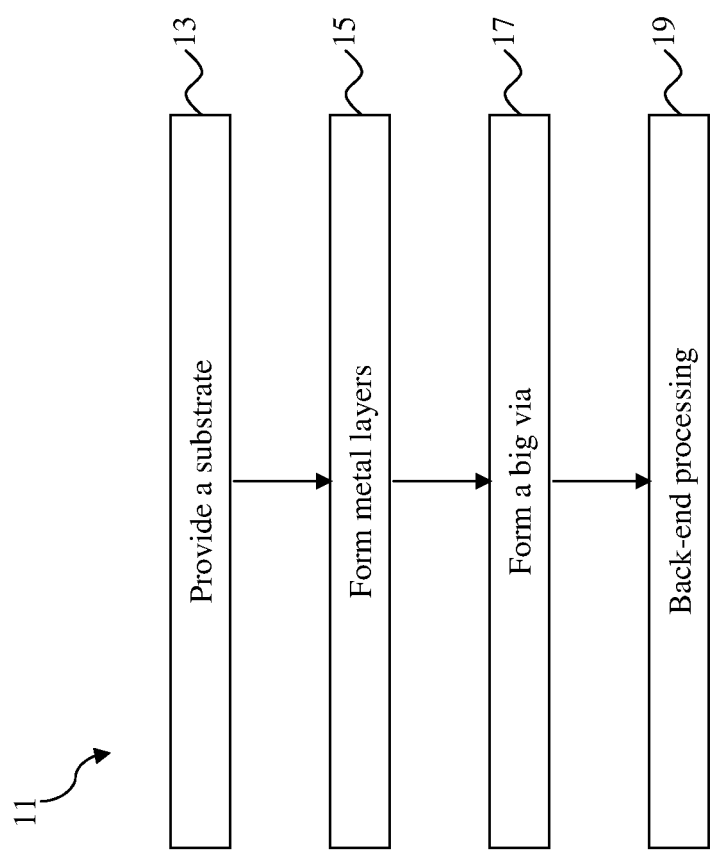
FIG. 1 is a flowchart illustrating a method of forming a via in a semiconductor device according to various aspects of the present disclosure.

It is understood that the following disclosure provides many different embodiments, or examples, for implementing different features of various embodiments. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Examples of devices that can benefit from one or more embodiments of the present invention are semiconductor devices with image sensors. Further examples of such devices are a back-side illuminated (BSI) image sensor device and a front-side illuminated (FSI) image sensor device. The following disclosure will continue with these examples to illustrate various embodiments of the present invention. It is understood, however, that the invention should not be limited to a particular type of device, except as specifically claimed.

Referring to FIG. 1, a method 11 for forming a bonding pad in a semiconductor device, such as a BSI image sensor device or a FSI image sensor device, is described. The method 11 begins with step 13 in which a substrate is provided. The method 11 continues with step 15 in which metal layers are formed. The metal layers include a first metal line that is formed over the substrate in a bonding pad region, and a second metal line that is formed over the substrate in a non-bonding pad region. The bonding pad region is different from the non-bonding pad region. The method 11 continues with step 17 in which a big via is formed. The big via has a first width and is formed over the first metal line. Also, a small via having a second width is formed over the second metal line. The first width is substantially greater than the second width. The method 11 continues with step 19 in which back-end processing is performed. The back-end processing includes wire-bonding a ball to a bonding pad, where the bonding pad is located above the big via. The method 11 is carried out with respect to a BSI image sensor device, as discussed immediately below in association with FIGS. 2-9. The method 11 is also carried out with respect to a FSI image sensor device, as discussed further below in association with FIGS. 10-13.

Figure 2:
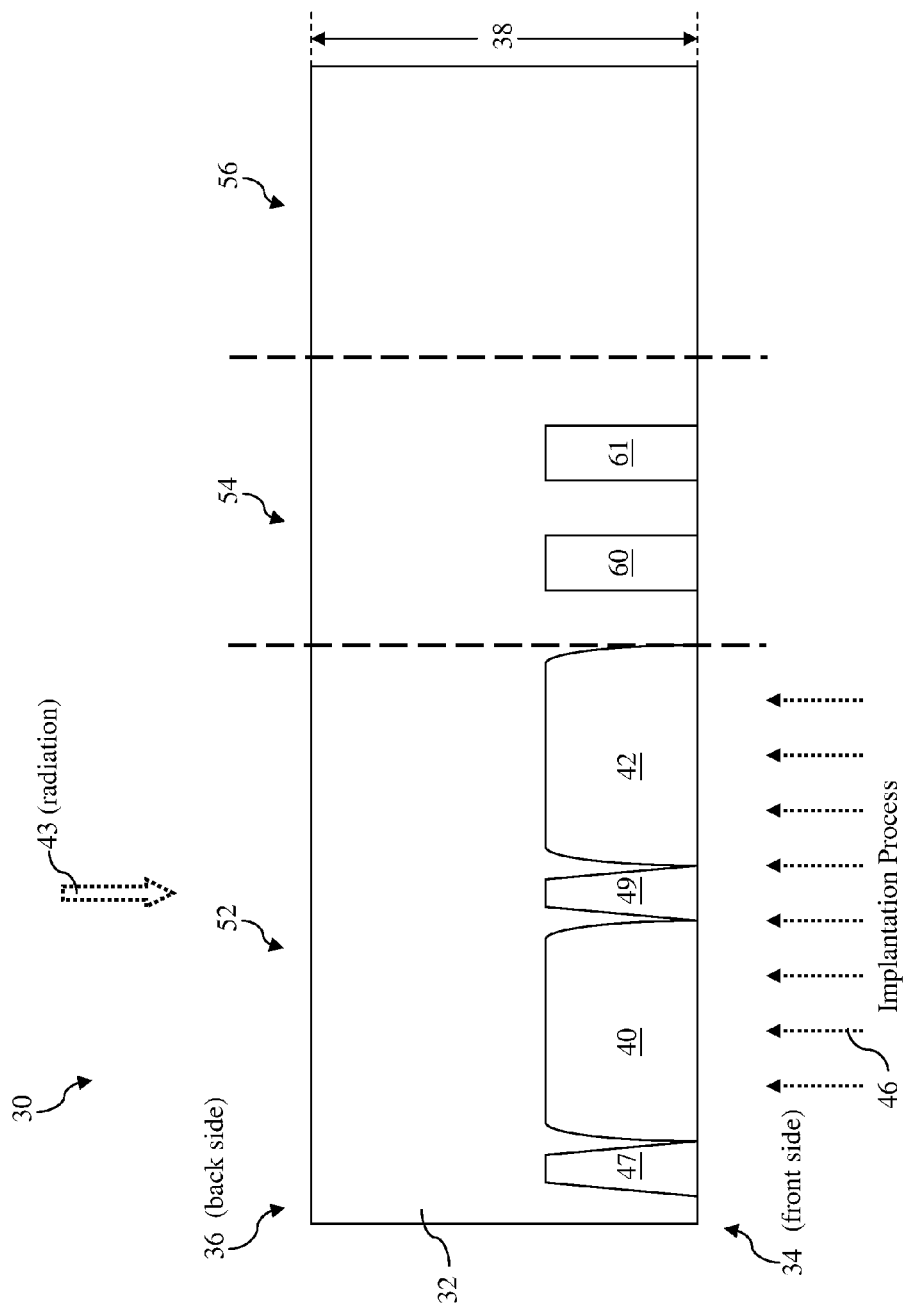
FIGS. 2 to 9 illustrate diagrammatic cross-sectional side views of one embodiment of a semiconductor device at various stages of fabrication according to the method of FIG. 1.

With reference to FIG. 2, the BSI image sensor device 30 includes a device substrate 32. The device substrate 32 is a silicon substrate doped with a p-type dopant such as boron (for example a p-type substrate). Alternatively, the device substrate 32 could be another suitable semiconductor material. For example, the device substrate 32 may be a silicon substrate that is doped with an n-type dopant such as phosphorous or arsenic (an n-type substrate). The device substrate 32 could include other elementary semiconductors such as germanium and diamond. The device substrate 32 could optionally include a compound semiconductor and/or an alloy semiconductor. Further, the device substrate 32 could include an epitaxial layer (epi layer), may be strained for performance enhancement, and may include a silicon-on-insulator (SOI) structure. Referring back to FIG. 2, the device substrate 32 has a front side 34 and a back side 36. The device substrate 32 also has an initial thickness 38 that is in a range from about 100 microns (um) to about 3000 um. In the present embodiment, the initial thickness 38 is about 750 um.

Radiation-sensing regions—for example, pixels 40 and 42—are formed in the device substrate 32. The pixels 40 and 42 are operable to sense radiation, such as an incident light 43 (thereafter referred to as light 43), that is projected toward the back side 36 of the device substrate 32. The pixels 40 and 42 each include a photodiode in the present embodiment. In other embodiments, the pixels 40 and 42 may include pinned layer photodiodes, photogates, reset transistors, source follower transistors, and transfer transistors. Further, the pixels 40 and 42 may be varied from one another to have different junction depths, thicknesses, and so forth. For the sake of simplicity, only two pixels 40 and 42 are illustrated in FIG. 2, but it is understood that any number of radiation-sensing regions may be implemented in the device substrate 32. Referring back to FIG. 2, the pixels 40 and 42 are formed by performing an implantation process 46 on the device substrate 32. The implantation process 46 includes doping the device substrate 32 with a p-type dopant such as boron. In an alternative embodiment, the implantation process 46 may include doping the device substrate 32 with an n-type dopant such as phosphorous or arsenic.

Referring back to FIG. 2, the device substrate 32 includes isolation structures—for example, isolation structures 47 and 49—that provide electrical and optical isolation between the pixels 40 and 42. The isolation structures 47 and 49 include shallow trench isolation (STI) structures that are formed of a dielectric material such as silicon oxide or silicon nitride. In other embodiments, the isolation structures 47 and 49 may include doped isolation features, such as heavily doped n-type regions. For the sake of simplicity, only two isolation structures 47 and 49 are illustrated in FIG. 2, but it is understood that any number of isolation structures may be implemented in the device substrate 32 so that the radiation-sensing regions such as pixels 40 and 42 may be properly isolated.

Still referring to FIG. 2, the pixels 40 and 42 and isolation structures 47 and 49 are formed in a region of the BSI image sensor device 30 referred to as a pixel region 52. The image sensor device 30 also includes a periphery region 54 and a bonding pad region 56. The dashed lines in FIG. 2 designate the boundaries between the regions 52, 54, and 56. The pixel region 52 and the periphery region 54 may also be referred to as non-bonding pad regions. The periphery region 54 includes micro-electronic devices 60 and 61. For example, the devices 60 and 61 in the present embodiment may be digital devices, such as application-specific integrated circuit (ASIC) devices or system-on-chip (SOC) devices. As another example, the devices 60 and 61 may be reference pixels that are used to establish a baseline of an intensity of light for the BSI image sensor device 30. The bonding pad region 56 is a region where one or more bonding pads (not illustrated in FIG. 2) of the BSI image sensor device 30 will be formed in a later processing stage, so that electrical connections between the BSI image sensor device 30 and external devices may be established. It is also understood that these regions 52, 54, and 56 extend vertically above and below the device substrate 32.

Figure 3:
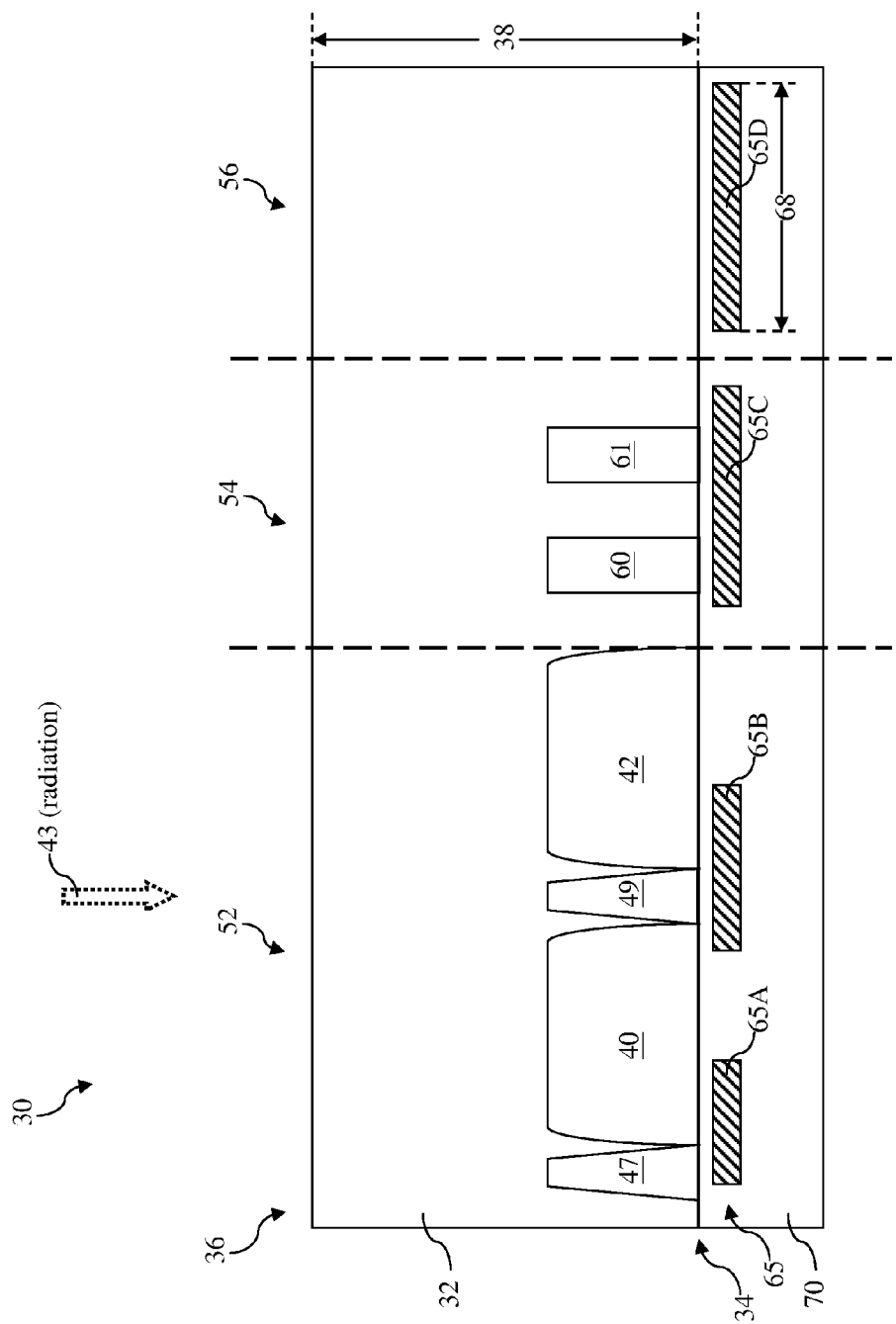

Referring to FIG. 3, a conductive layer 65 is formed over the front side 34 of the BSI image sensor device 30. In the present embodiment, the conductive layer 65 includes a layer of aluminum material that is sandwiched between two layers of titanium nitride material. The conductive layer 65 is formed by a high density plasma chemical vapor deposition (HDPCVD) process known in the art. In an alternative embodiment, the conductive layer 65 may include conductive materials such as aluminum, aluminum/silicon/copper alloy, titanium, titanium nitride, tungsten, polysilicon, metal silicide, or combinations thereof. In another alternative embodiment, the conductive layer 65 may include copper, copper alloy, titanium, titanium nitride, tantalum, tantalum nitride, tungsten, polysilicon, metal silicide, or combinations thereof. The conductive layer 65 in the alternative embodiments may be formed by processes such as physical vapor deposition (PVD), chemical vapor deposition (CVD), atomic layer deposition (ALD), sputtering, plating, or combinations thereof.

Referring back to FIG. 3, it is understood that before the formation of the conductive layer 65, active and/or passive devices such as various doped features, circuitry, and input/output of the BSI image sensor device 30 may be formed. In addition, contacts that provide electrical interconnections between the active and/or passive devices and the conductive layer 65 may be formed. For the sake of simplicity, these active and/or passive devices and the contacts are not illustrated. In the present embodiment, the conductive layer 65 is the first conductive layer that is formed over the front side 34 of the BSI image sensor device 30.

The conductive layer 65 is patterned to form various conductive lines. For example, conductive lines 65A and 65B are formed in the pixel region 52, a conductive line 65C is formed in the periphery region 54, and a conductive line 65D is formed in the bonding pad region 56. The conductive line 65D has a width 68. The width 68 has a range that is between about 30 um to about 200 um and may be varied depending on design and manufacturing requirements. After the conductive lines 65A-65D are formed, a dielectric layer 70 is formed over the front side 34 of the BSI image sensor device 30 and over the conductive lines 65A-65D. The dielectric layer 70 includes an insulating material such as silicon oxide, silicon nitride, silicon oxynitride, or combinations thereof. The dielectric layer 70 is formed by a process that may include CVD, PVD, ALD, or combinations thereof.

Figure 4:
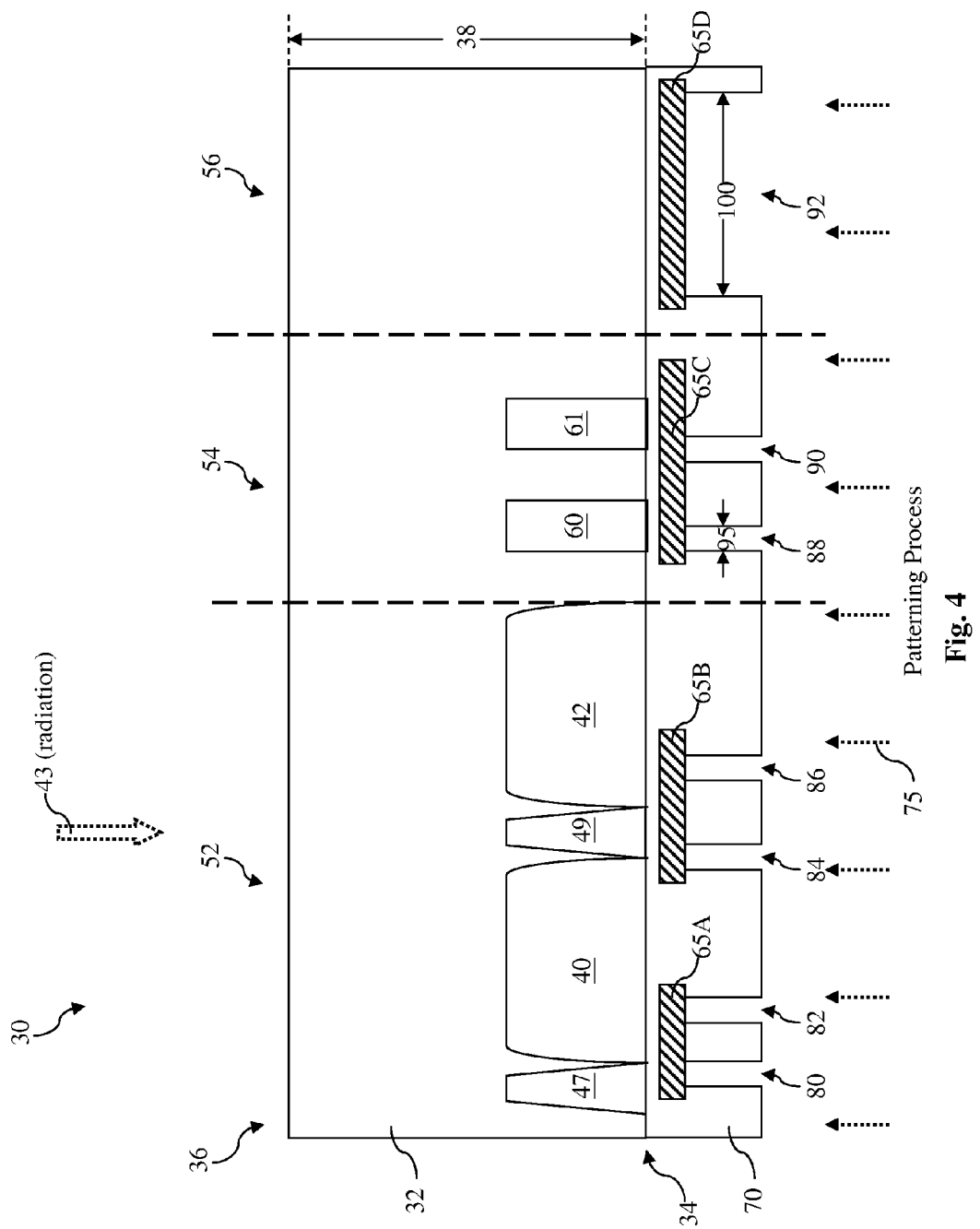

Referring now to FIG. 4, the dielectric layer 70 is patterned using a patterning process 75 to form a plurality of openings. For example, openings 80, 82, 84, and 86 are formed in the pixel region 52, openings 88 and 90 are formed in the periphery region 54, and an opening 92 is formed in the bonding pad region 56. The patterning process 75 includes a photolithography process and a reactive ion etching (RIE) process to define and form the openings 80-92. In the present embodiment, the openings 80-90 each have a width that is approximately equal to a width 95, and the opening 92 has a width 100 that is substantially greater than the width 95 of the openings 80-90. In one embodiment, the width 95 has a range that is between about 0.1 um to about 0.5 um, for example 0.3 um, and the width 100 has a range that is between about 30 um to about 200 um, for example about 150 um. In another embodiment, the width 100 of the opening 92 is approximately equal to the width 68 of the conductive line 65D. It is understood that these ranges are merely exemplary to illustrate that the width 100 is substantially greater than the width 95. The widths 95 and 100 may have other values in alternative embodiments or if the fabrication technology generation changes.

Figure 5:
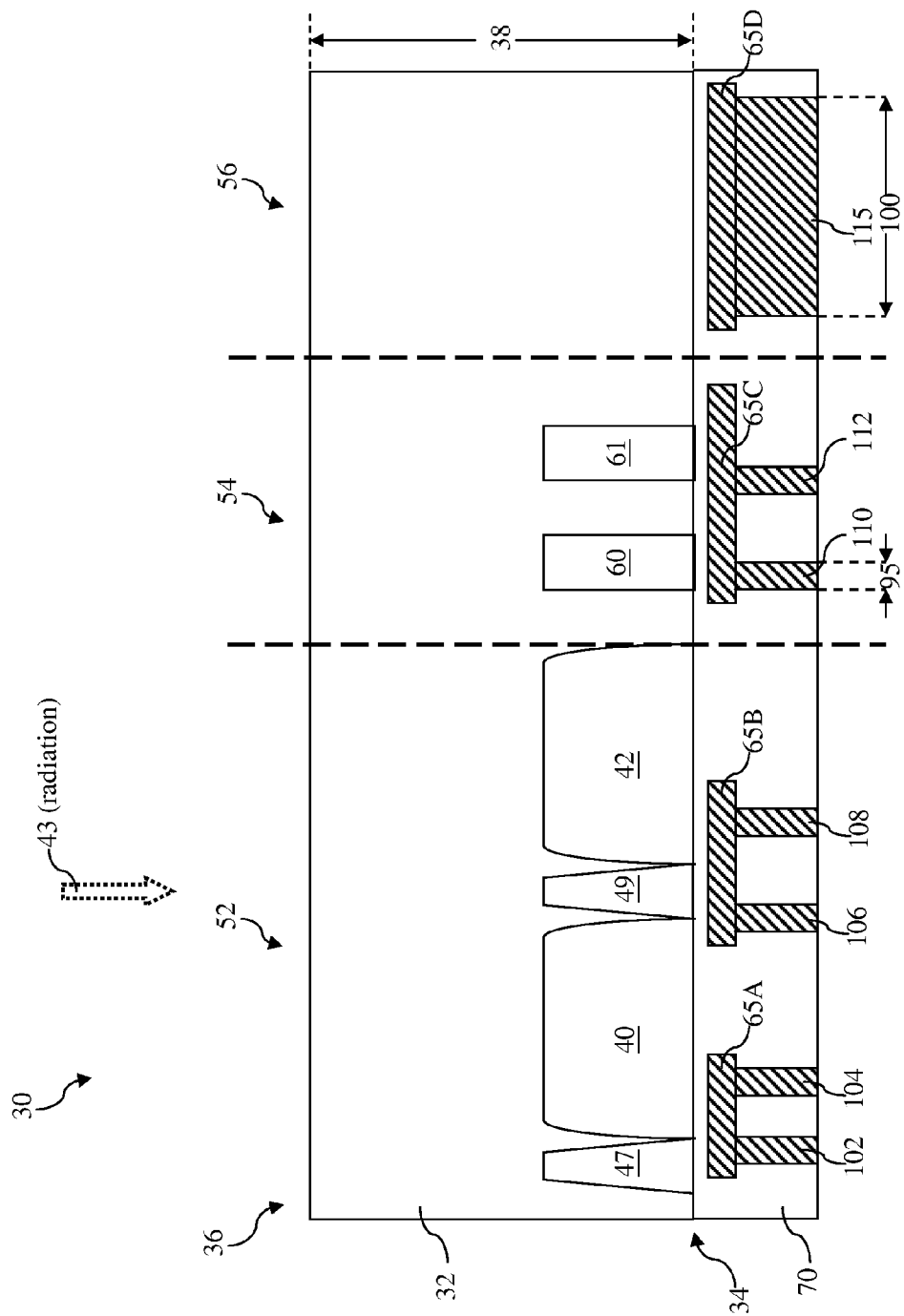

Referring now to FIG. 5, vias 102, 104, 106, and 108 are formed in the pixel region 52 by filling the openings 80, 82, 84, and 86, respectively, with a conductive material. Vias 110 and 112 are formed in the periphery region 54 by filling the openings 88 and 90, respectively, with the conductive material. Vias 102-108 and vias 110-112 may each be referred to as via arrays. A via 115 is formed by filling the opening 92 with the conductive material. The conductive material is tungsten in the present embodiment, but may be another suitable conductive material in alternative embodiments. The conductive material is formed by a deposition process known in the art, such as CVD or PVD. A chemical-mechanical-polishing (CMP) process is then performed on the vias 102-115 to ensure that the surface of the vias 102-115 are smooth and approximately co-planar with a surface of the dielectric material 70. The via 115 in the bonding pad region 56 has the width 100, and the vias 102-112 in the non-bonding pad regions 52 and 54 each have widths approximately equal to the width 95. As mentioned above, the width 100 is substantially greater than the width 95. Thus, the via 115 is substantially greater than the vias 102-112 in size (or dimension).

Figure 6:
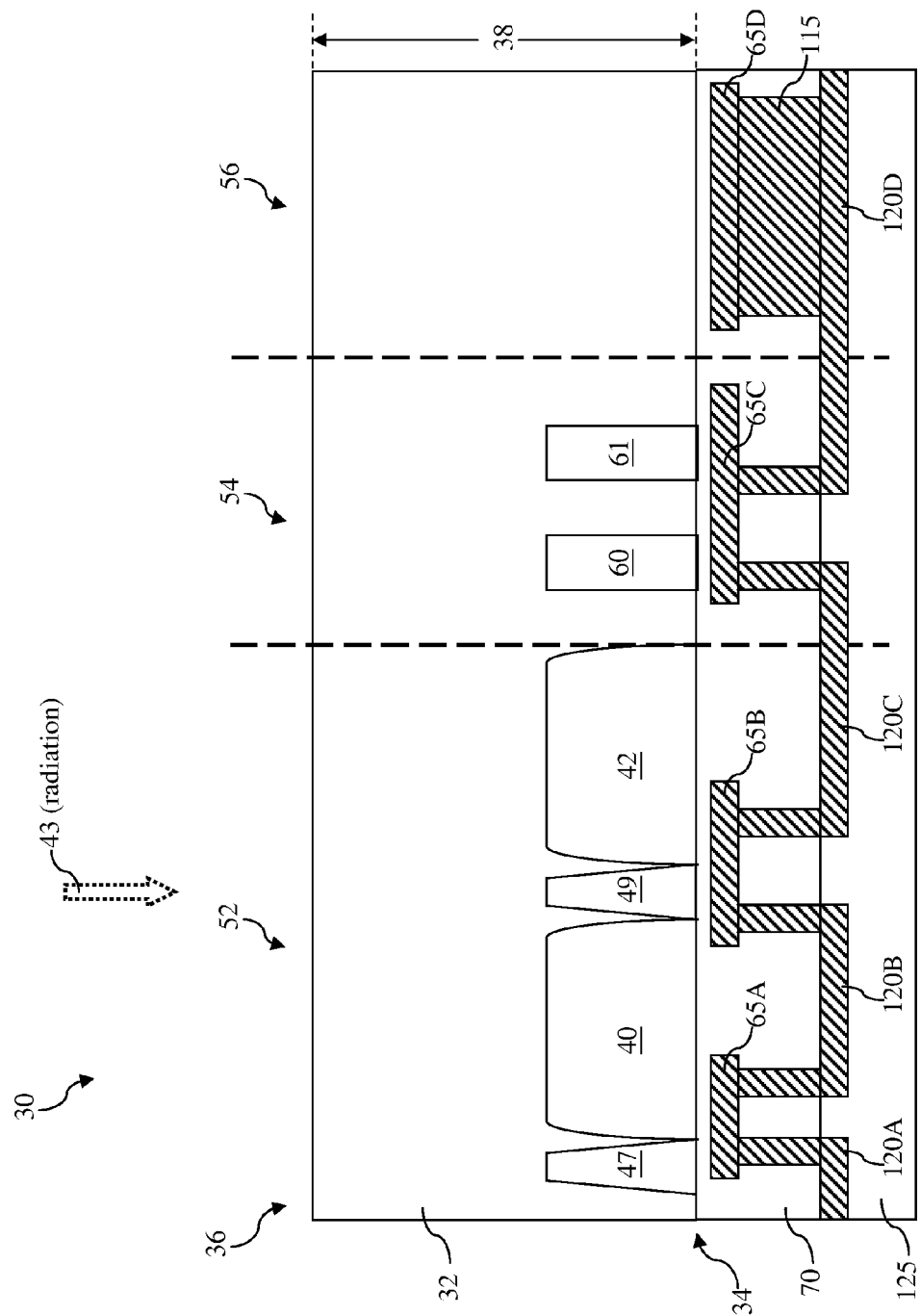

Referring now to FIG. 6, a conductive layer 120 is formed over the dielectric layer 70 and over the vias 102-115. The formation and material composition of the conductive layer 120 are similar to those of the conductive layer 65 described above. The conductive layer 120 is then patterned to form a plurality of conductive lines, for example, conductive lines 120A-120D. Electrical connections between the conductive layer 65 and the conductive layer 120 are established by the vias 102-115. Further, electrical interconnections between various vias 102-115 may also be provided by the various conductive lines in each of the conductive layers 65 and 120. Thereafter, a dielectric layer 125 is formed over the conductive lines 120A-120D. The formation and material composition of the dielectric layer 125 are similar to those of the dielectric layer 70 described above. It is understood that additional conductive layers and vias may be formed over the front side 34 of the BSI image sensor device 30, but for the sake of simplicity, these conductive layers and vias are not illustrated. It is also understood that the illustrations of the various conductive lines and vias are merely exemplary, and the number of conductive lines and vias as well as actual positioning and configuration of the conductive lines and vias may vary depending on design needs.

Figure 7:
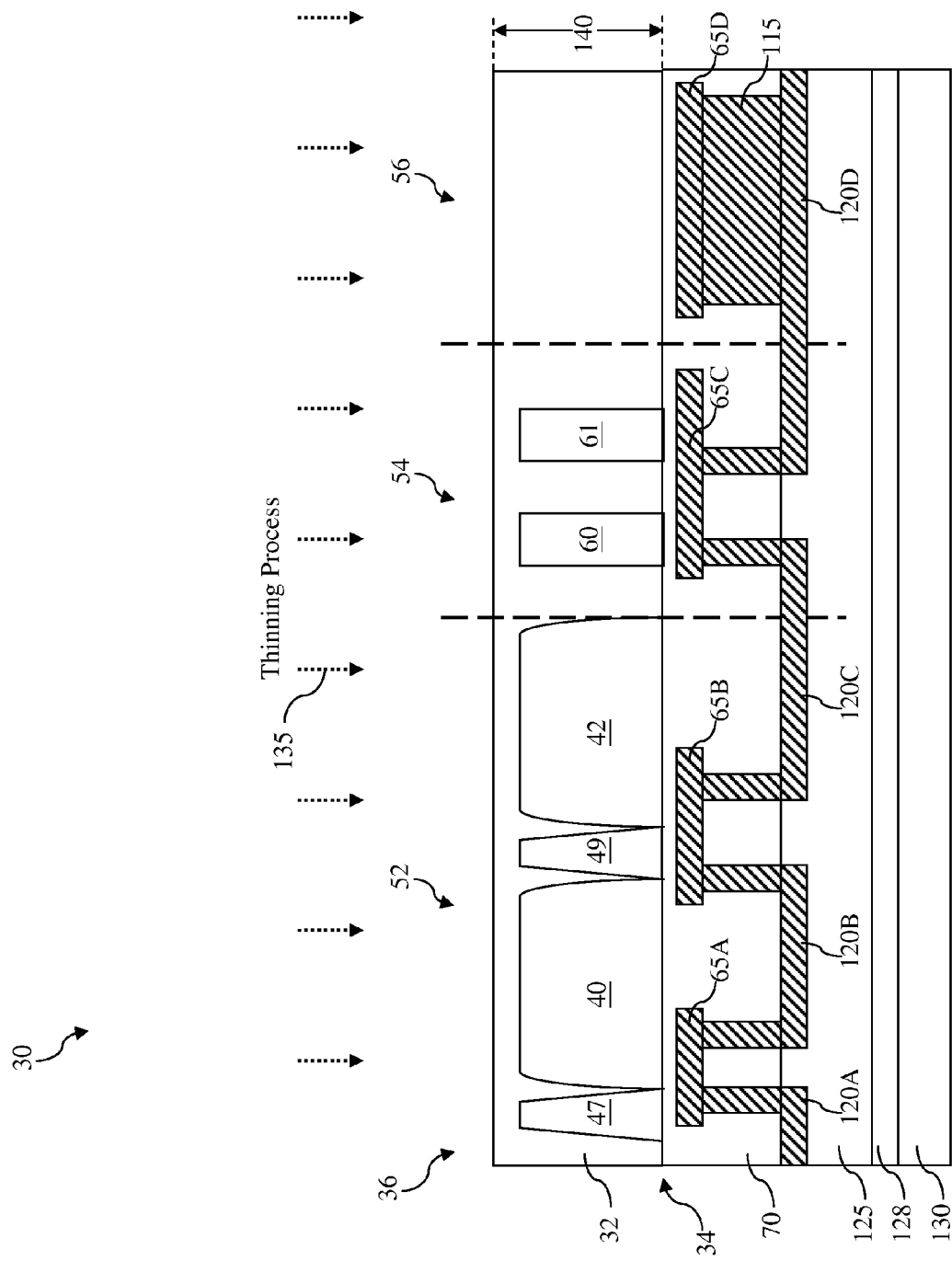

Referring now to FIG. 7, a buffer layer 128 is formed over the dielectric layer 125 in the front side 34 of the BSI image sensor device 30. In the present embodiment, the buffer layer 128 includes a dielectric material such as silicon oxide. Alternatively, the buffer layer 128 may optionally include silicon nitride. The buffer layer 128 is formed by CVD, PVD, or other suitable techniques known in the art. The buffer layer 128 is planarized by a CMP process to form a smooth surface. Thereafter, a carrier substrate 130 is bonded with the device substrate 32 through the buffer layer 128, so that processing the back side 36 of the device substrate 32 can be performed. The carrier substrate 130 in the present embodiment is similar to the substrate 32 and includes a silicon material. Alternatively, the carrier substrate 130 may include a glass substrate or another suitable material. The carrier substrate 130 may be bonded to the device substrate 32 by molecular forces—a technique known as direct bonding or optical fusion bonding—or by other bonding techniques known in the art, such as metal diffusion or anodic bonding. After bonding, the device substrate 32 and the carrier substrate 130 may optionally be annealed to enhance bonding strength. The buffer layer 128 provides electrical isolation between the device substrate 32 and the carrier substrate 130. The carrier substrate 130 provides protection for the various features formed on the front side 34 of the device substrate 32, such as the pixels 40 and 42. The carrier substrate 130 also provides mechanical strength and support for processing the back side 36 of the device substrate 32 as discussed below.

Referring back to FIG. 7, a thinning process 135 is performed on the device substrate 32 from the back side 36 to reduce the thickness of the device substrate 32. The thinning process 135 may include a mechanical grinding process and a chemical thinning process. A substantial amount of substrate material may be first removed from the device substrate 32 during the mechanical grinding process. Afterwards, the chemical thinning process may apply an etching chemical to the back side 36 of the device substrate 32 to further thin the device substrate 32 to a thickness 140. In the present embodiment, the thickness 140 is less than about 5 um. It is also understood that the particular thicknesses disclosed in the present disclosure are mere examples, and other thicknesses may be implemented depending on the type of application and design requirements of the BSI image sensor device 30.

Figure 8:
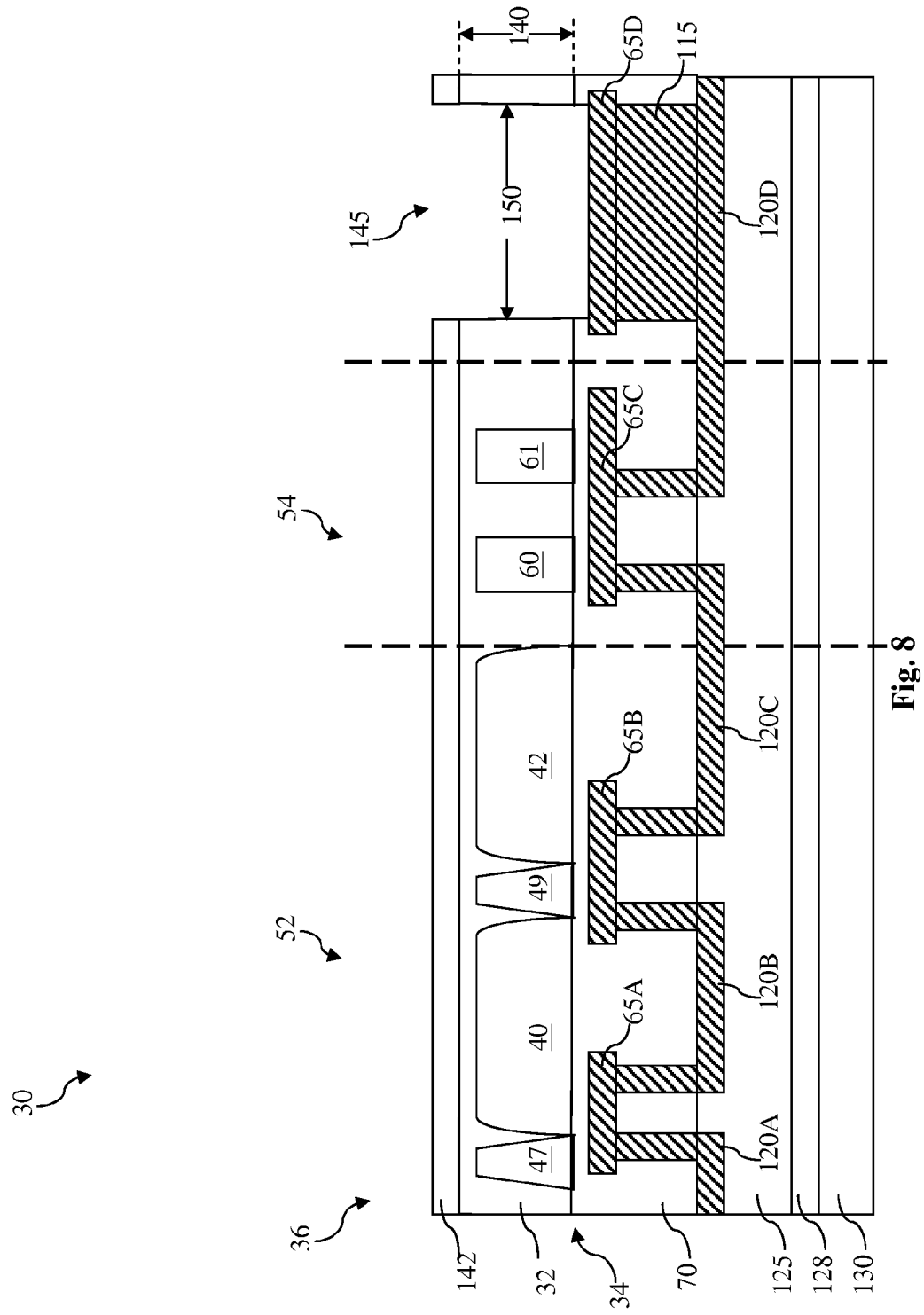

Referring now to FIG. 8, a passivation layer 142 is formed over the back side 36 of the BSI image sensor device 30. The passivation layer 142 includes a nitride or oxide material, or combinations thereof. The passivation layer 142 is formed by a process that may include CVD, PVD, ALD, or combinations thereof. Thereafter, an opening 145 is formed in the bonding pad region 56 of the device substrate 32 (and through the passivation layer 142), so that a portion of the conductive line 65D in the bonding pad region 56 is exposed from the back side 36. The opening 145 is formed by an etching process known in the art, such as a dry etching or wet etching process. The opening 145 has a width 150. In the present embodiment, the width 150 is less than the width 68 of the conductive line 65D. In another embodiment, the width 150 is approximately equal to the width 68 of the conductive line 65D. In another embodiment, the width 100 of the via 115 is greater than about ½ of the width 150 of the opening 145.

Figure 9:
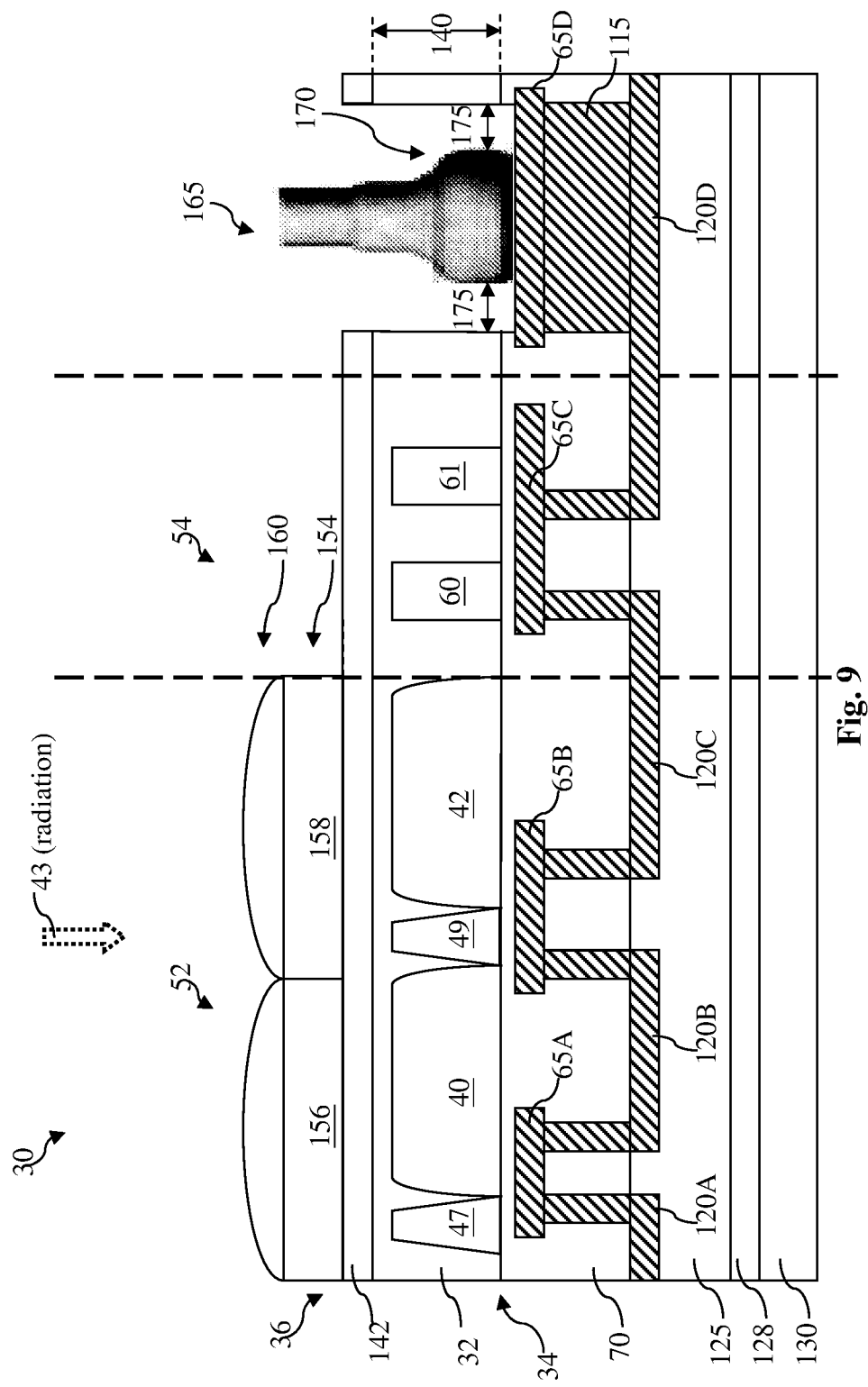

Referring now to FIG. 9, a color filter layer 154 is then formed over the passivation layer 142. The color filter layer 154 is formed within the pixel region 52 of the BSI image sensor device 30. The color filter layer 154 can support different color filters (e.g., red, green, and blue), and may be positioned such that the incident light radiation (such as the incident light 43) is directed thereon and there through. For example, the color filter layer 154 includes a color filter 154A for filtering light radiation of a first wavelength and a color filter 154B for filtering light radiation of a second wavelength, so that light having different colors corresponding to the first and second wavelengths are filtered by the color filters 154A and 154B, respectively. The color filters 154A, 154B may include a dye-based (or pigment based) polymer or resin for filtering a specific wavelength band. A micro-lens layer 160 having a plurality of micro-lenses is then formed over the color filter layer 154 for directing and focusing light radiation towards the pixels in the device substrate 32. The lenses in the micro-lens layer 160 may be positioned in various arrangements and have various shapes depending on a refractive index of material used for the micro-lens and distance from a sensor surface. The BSI image sensor device 30 may also undergo another laser annealing process before the forming of the color filters.

Still referring to FIG. 9, the exposed portion of the conductive line 65D is bonded to a bonding wire 165 through the opening 145 using a wire bonding process known in the art. Thus, the conductive line 65D may also be referred to as a bonding pad. The wire bonding process includes a ball bonding process in the present embodiment, in which a tip portion of the bonding wire 165 is melted to form a bonding ball 170 at an interface between the bonding wire 165 and the bonding pad 65D. The bonding wire 165 and thus the bonding ball 170 include a conductive material. In one embodiment, the bonding wire 165 and the bonding ball 170 include gold. In other embodiments, the bonding wire 165 and the bonding ball 170 may include copper or another suitable metal. The bonding ball 170 has a size that is smaller than the width 150 of the bonding pad 65D, such that a clearance distance 175 exists on either side between edges of bonding ball 170 and boundaries of the opening 145. In the present embodiment, the clearance distance 175 is in a range from about 2 um to about 3 um.

Existing methods fabricating the BSI image sensor 30 form small vias (such as via arrays) in the bonding pad region 56. For example, vias having approximately the same size and dimension (example, the width 95) as the vias 102-112 are formed in the bonding pad region 56 and beneath the bonding pad 65D using existing methods. These relatively small vias give rise to a number of fabrication issues. For example, there may be a "wire bond non-stack on pad" issue. Essentially, it is difficult to securely attach the bonding wire 165 to the bonding pad 65D. This may be due to the fact that the bonding pad 65D is relatively thin, such that the bonding pad 65D does not provide sufficient mechanical support for the stress that may occur during the ball bonding process, which may then lead to poor bonding between the bonding wire 165 and the bonding pad 65D. Another issue is bonding pad peeling, meaning that the bonding pad 65D may peel off from an array of small vias therebelow. Bonding pad peeling may occur due to insufficient contact surface area between the bonding pad 65D and the small vias therebelow (since each via has a relatively small surface area). Another issue associated with using small vias in the bonding pad region 56 is the cracking of interlayer dielectric. The interlayer dielectric refers to portions of the dielectric layer 70 that would exist between the small vias. The dielectric layer 70 is typically formed of a silicon oxide material, which is similar to glass. When stress is applied, such as during bonding, the portions of the dielectric layer 70 between the small vias in the bonding pad region 56 may succumb to the stress and begin to crack. All of these issues described above would adversely affect the performance and yield of the BSI image sensor device 30.

In the present embodiment, however, these issues are overcome by forming a large via 115 in the bonding pad region 56. With respect to the wire bond non-stack on pad issue, since the size (or width) of the large via 115 is close enough to (and in some embodiments, approximately equal to) the bonding pad 65D, the large via 115 essentially extends the thickness of the bonding pad 65D, making the bonding pad 65D thicker and thus more capable of providing sufficient mechanical support to withstand the bonding stress. With respect to the bonding pad peeling issue, the large via 115 offers more surface contact area with the bonding pad 65D, and therefore the bonding pad 65D is less likely to peel off from the via 115. Furthermore, since the via 115 is just one large via, there is no glass-like dielectric material within the large via 115. Hence, the interlayer dielectric cracking issue does not exist in the present embodiment.

Referring now to FIGS. 1 and 10-13, in another embodiment, a FSI image sensor device 180 includes an array or grid of pixels 182, 184 separated by isolation structures 185, 186. The pixels 182, 184 can be similar to the pixels 40, 42 of the above-described BSI image sensor 30, modified as necessary for front-side illumination.

Figure 10:
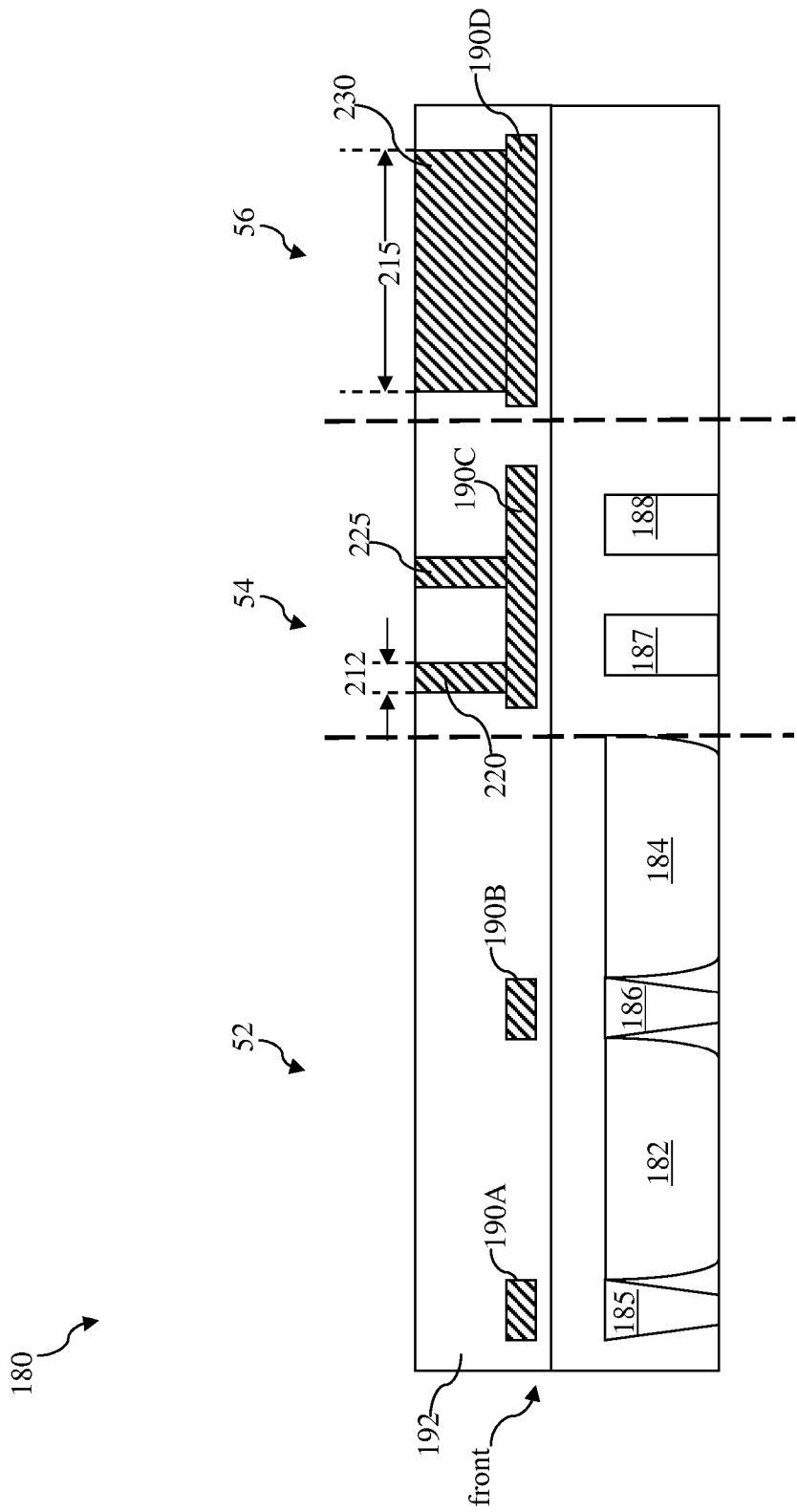
FIGS. 10-13 illustrate diagrammatic cross-sectional side views of another embodiment of the semiconductor device at various stages of fabrication according to the method of FIG. 1.

In accordance with step 15 of method 11 (FIG. 1), FIG. 10 shows a conductive layer 190 that is formed over the front side of the FSI image sensor device 180. The composition and formation of the conductive layer 190 are similar to those of the conductive layer 65 described above for the BSI image sensor device 30. The conductive layer 190 is patterned to form conductive lines 190A, 190B, 190C, and 190D. Since the incident light is projected toward the front side of the FSI image sensor device 180, the conductive lines 190A and 190B in the pixel region 52 are positioned in a way such that they do not significantly obstruct the path of the incident light. It is understood that before the formation of the conductive lines 190A-190D, other conductive layers, vias, and contacts may be formed over the front side of the FSI image sensor device 180. Therefore, the conductive layer 190 may be formed over another (or a plurality of) conductive layers therebelow. For the sake of simplicity and clarity, other conductive layers, vias, and contacts that are formed before the conductive layer 190 are not illustrated. A dielectric layer (IMD) 192 is also formed around and over the conductive lines 190A-190D.

The dielectric layer 192 is patterned using a patterning process to form openings in the periphery region 54, and an opening in the bonding pad region 56. The patterning process includes processes that are similar to the processes included in the patterning process 75 described above in association with the BSI image device. In the present embodiment, the openings in the periphery region 54 each have a width that is approximately equal to a width 212, and the opening in the bonding pad region 56 has a width 215 that is substantially greater than the width 212. In one embodiment, the width 212 has a range that is between about 0.1 um to about 0.5 um, for example 0.3 um, and the width 215 has a range that is between about 30 um to about 200 um, for example about 150 um. It is understood that these ranges are merely exemplary to illustrate that the width 215 is substantially greater than the width 212. The widths 212 and 215 may have other values in alternative embodiments or if the fabrication technology generation changes.

In accordance with step 17 of method 11 (FIG. 1), FIG. 10 shows vias 220, 225, and 230 that are formed by filling the openings in the bonding periphery region 54 and the bonding pad region 56. The via 230 has the width 215, and the vias 220 and 225 each have widths that are approximately equal to the width 212. Thus, the via 230 is substantially greater than the vias 220 and 225 in size (or dimension), and is referred to as a "big via."

Figure 11:
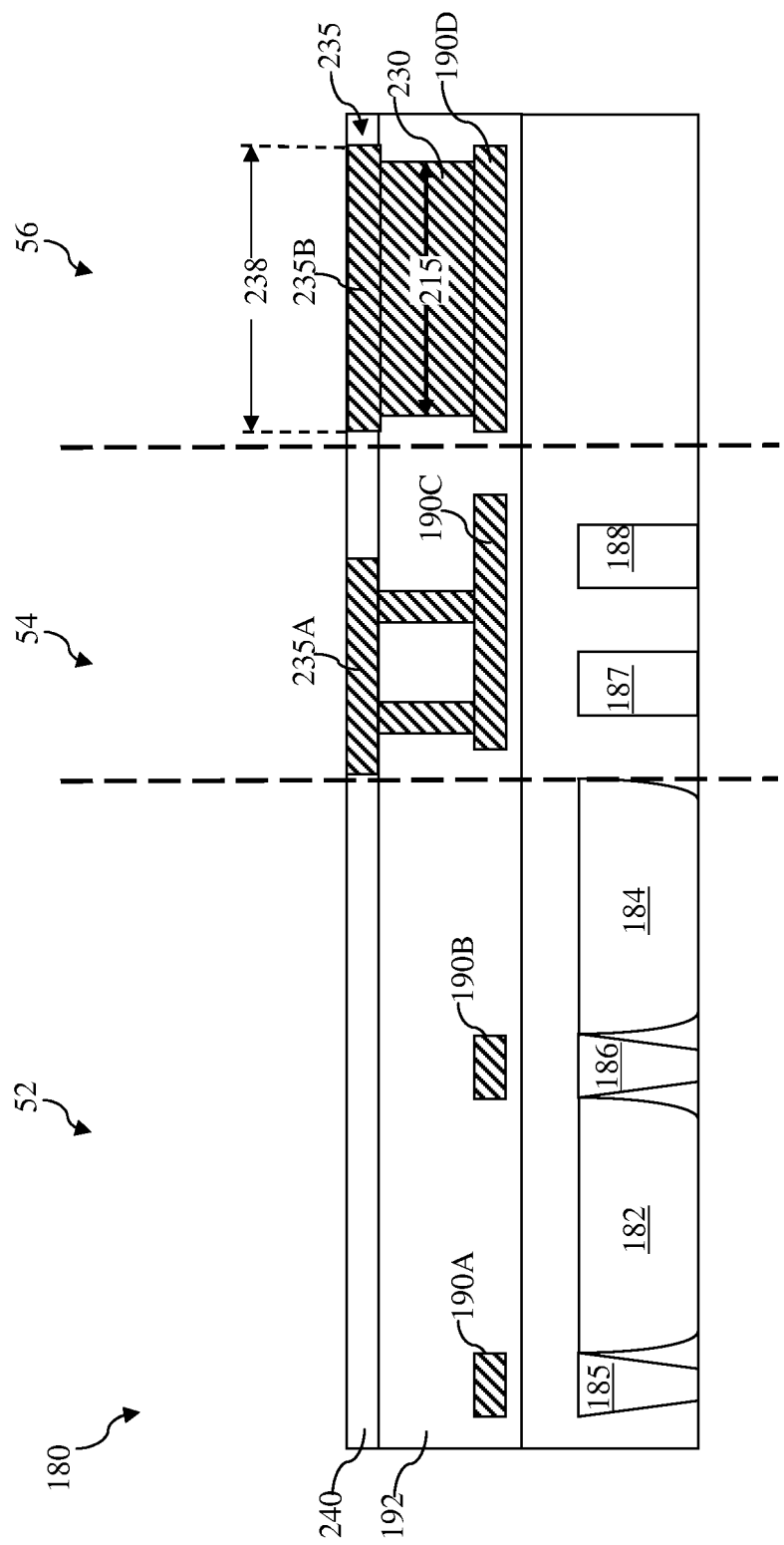

Referring to FIG. 11, a conductive layer 235 is formed over the dielectric layer 192. The conductive layer 235 is the top-most metal layer. The material composition and formation of the conductive layer 235 are similar to those of the conductive layer 120 described above in association with the BSI image sensor. The conductive layer 235 is patterned to form a conductive line 235A in the periphery region 54 and a conductive line 235B in the bonding pad region 56. The conductive line 235B has a width that is greater than the width 215 of the via 230. In another embodiment, the width of conductive line 235B is approximately equal to the width 215. It is understood that the various conductive lines and vias illustrated in the figure are merely exemplary, and the number of conductive lines and vias as well as actual positioning and configuration of the conductive lines vias may vary depending on design needs. A dielectric layer 240 is formed around and over the dielectric layer 192 and conductive lines 235A and 235B.

Figure 12:
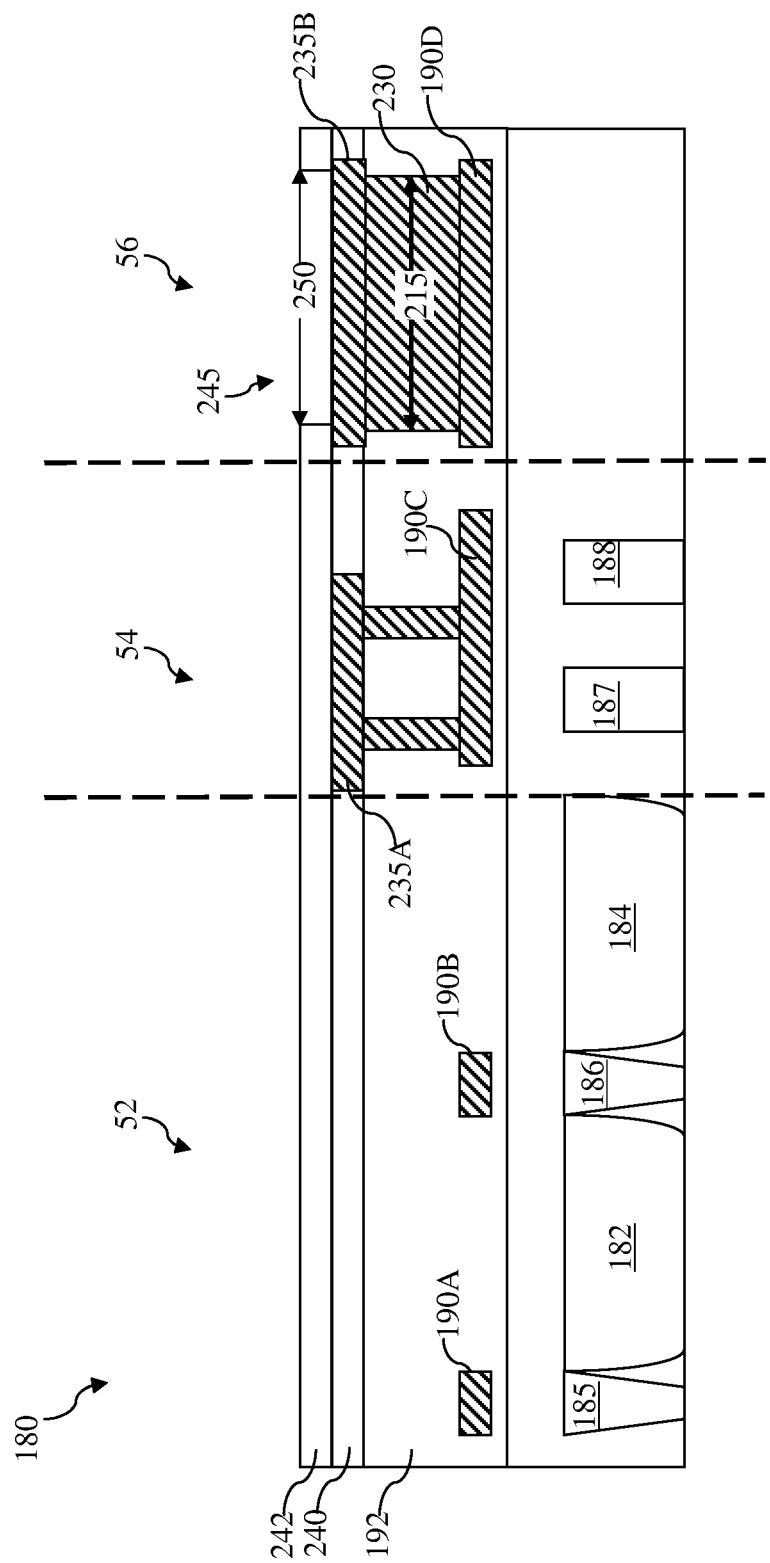

In accordance with step 19 of method 11 (FIG. 1), FIG. 12 shows a passivation layer 242 that is formed over the dielectric layer 240 and the conductive lines 235A and 235B. Thereafter, an opening 245 is formed through the passivation layer 242 in the bonding pad region 56, so that a portion of the conductive line 235B in the bonding pad region 56 is exposed from the front side. The opening 245 is formed by an etching process known in the art, such as a dry etching or wet etching process. The opening 245 has a width 250. In the present embodiment, the width 250 is less than the width of the conductive line 235B. In another embodiment, the width 250 is approximately equal to the width 238. In yet another embodiment, the width 215 of the via 230 is greater than about 2 um per side of the width 250 of the opening 245.

A color filter layer 254 is then formed over the passivation layer 242. The color filter layer 254 is formed within the pixel region 52 of the FSI image sensor device 180. The micro-lens layer 260 having a plurality of micro-lenses is then formed over the color filter layer 254 for directing and focusing light radiation towards the pixels in the substrate.

Figure 13:
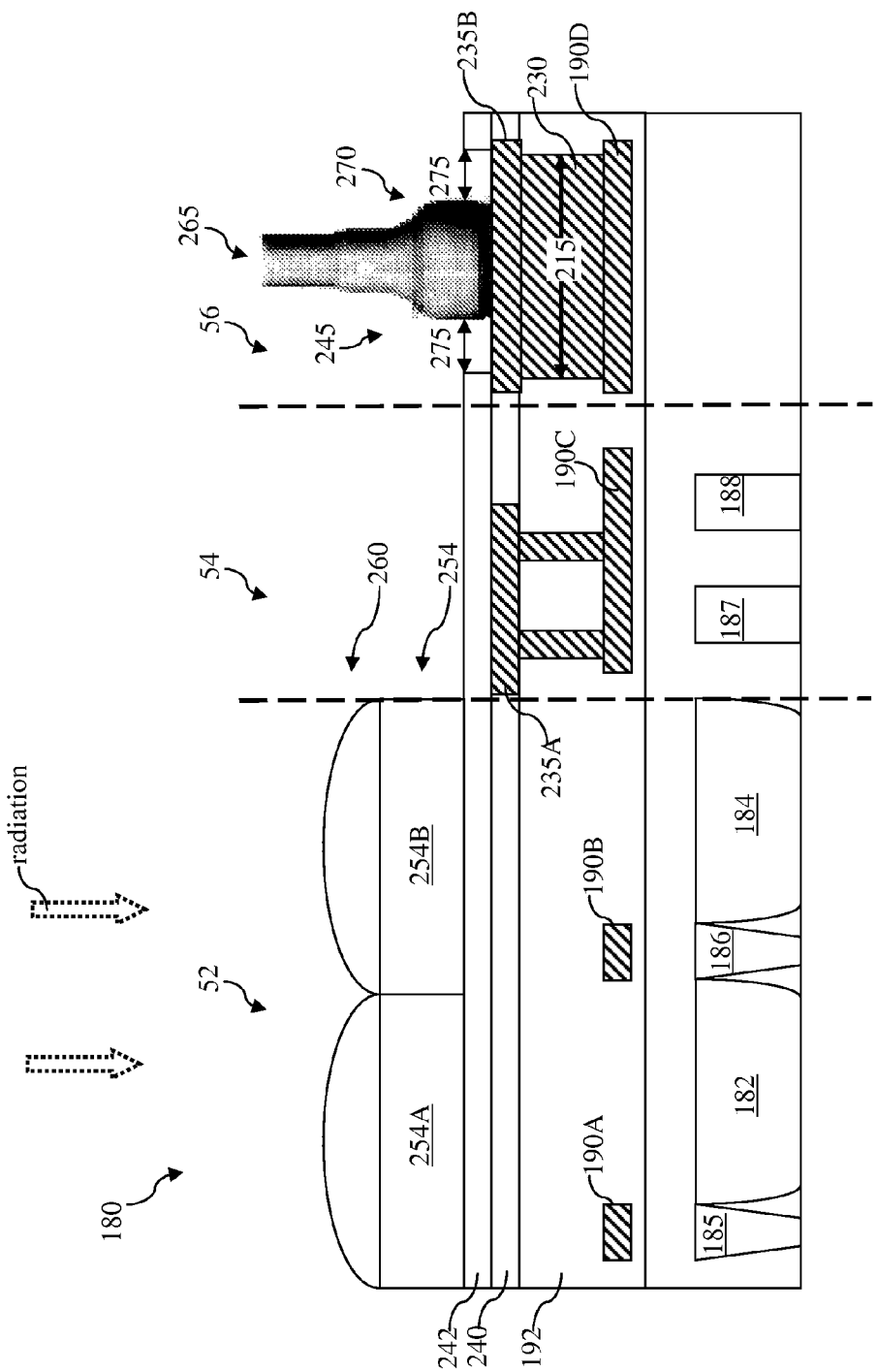

Referring now to FIG. 13, the exposed portion of the conductive line 235B is bonded to a bonding wire 265 through the opening 245 using a wire bonding process known in the art. Thus, the conductive line 235B may also be referred to as a bonding pad. The wire bonding process includes a ball bonding process, in which a portion of the bonding wire 265 is melted to form a bonding ball 270. In one embodiment, the bonding wire 265 and the bonding ball 270 include gold. In other embodiments, the bonding wire 265 and the bonding ball 270 may include copper or another suitable metal. The bonding ball 270 has a size that is smaller than the width 250 of the opening 245, such that the clearance distance 275 exists on either side between edges of the bonding ball 270 and boundaries of the opening 245. In the present embodiment, the clearance distance 275 is in a range from about 2 um to about 3 um.

For reasons similar to those explained above for the BSI image sensor device 30 described in FIGS. 2-9, the FSI image sensor device 180 described in FIGS. 10-13 also does not suffer from the wire non-stack on pad, wire bonding peeling, and interlayer dielectric cracking issues associated with existing devices.

It is understood that the methods and devices described above may be used in conjunction with a "flip-chip" technology known in the art, in which solder bumps would be deposited on the bonding pad 235B. In order to mount the FSI image sensor device 180 to external circuitry (e.g., a circuit board or another chip or wafer), the image sensor device 180 is flipped over so that the side having the solder bump faces down. The bonding pad 235B is then aligned with bonding pads of the external circuitry. Thereafter, the solder bump is heated (for example, in an oven) so that the solder bump is melted and flowed, therefore creating sufficient bonding contact between the bonding pad of the image sensor and the bonding pad of the external circuitry to complete the flip chip bonding process.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. An integrated circuit, comprising:
   a substrate having a bonding pad region and a non-bonding pad region;
   a dielectric layer disposed on a front side of the substrate, the dielectric layer spanning over both the bonding pad region and the non-bonding pad region;
   an image sensor array for sensing light from a backside of the substrate;
   a first via formed entirely in the dielectric layer over the bonding region, the first via interconnecting a first group of conductive layers, the first via having a first dimension in a top view toward the substrate; and
   a plurality of second vias formed in the dielectric layer over the non-bonding region, the second via interconnecting a second group of conductive layers different from the first group, the plurality of second vias each having a second dimension in the top view and the second dimension being substantially less than the first dimension.

2. The integrated circuit of claim 1, wherein the first dimension ranges between about 30 micrometer and about 200 micrometer; and the second dimension ranges between about 0.1 micrometer and about 0.5 micrometer.

3. The integrated circuit of claim 1, wherein the non-bonding pad region comprises at least one of a peripheral region and a pixel region.

4. The integrated circuit of claim 3, wherein the pixel region comprises an image sensor.

5. The integrated circuit of claim 1, further comprising:
   a first metal line that is interconnected to the first via; and
   a second metal line that is interconnected to the second via;

wherein the first metal line functions, at least in part, as a bond pad.

6. The integrated circuit of claim 5, wherein the first metal line includes aluminum copper (AlCu), and has a thickness that is approximately equal to a thickness of the second metal line.

7. The integrated circuit of claim 1, wherein the substrate in the bonding pad region has a recess exposing a bonding pad that is a member of the first group of conductive layers;

and further comprising a bonding wire located through the recess and bonded to the bonding pad from the back side.

8. A backside illuminated image (BSI) sensor, comprising:
 a first substrate having a bonding region and a non-bonding region and having a front side and a backside;
 a dielectric material located on the front side of the first substrate;
 a first conductive line on the front side of the first substrate in the bonding region;
 a second conductive line on the front side of the first substrate in the non-bonding region;
 a first via having a first diameter over the first conductive line; and
 a second via having a second diameter over the second conductive line, the first diameter being substantially greater than the second diameter;
 wherein the first conductive line, the second conductive line, the first via, and the second via are all located completely within the dielectric material.

9. The BSI sensor of claim 8, further comprising:
 a second substrate bonded to the front side of the first substrate; and
 a third conductive line formed over the first via.

10. The BSI sensor of claim 8, wherein the first and second conductive lines are formed in a first metal layer.

11. The BSI sensor of claim 8, wherein the non-bonding region comprising a pixel region having at least one image sensor.

12. The BSI sensor of claim 8, further comprising a solder bump bonded to the first conductive line from the back side of the first substrate.

13. The BSI sensor of claim 8, wherein the first diameter ranges between about 30 micrometers and about 200 micrometers; and the second diameter ranges between about 0.1 micrometers and about 0.5 micrometers.

14. The BSI sensor of claim 8, wherein the first and second conductive lines comprise aluminum.

15. The BSI sensor of claim 8, wherein the first and second conductive lines are formed in different conductive layers.

16. An image sensor, comprising:
 a substrate having a front surface and a back surface opposite the front surface;
 a radiation-sensitive element formed in the substrate, the radiation-sensitive element being configured to detect radiation that enters the substrate through the back surface;
 one or more dielectric layers located over the front side of the substrate;
 a first via embedded in the one or more dielectric layers, the first via having a first lateral dimension; and
 a second via embedded in the one or more dielectric layers, the second via having a second lateral dimension substantially greater than the first lateral dimension, wherein the first via and the second via have substantially identical heights measured in a dimension different from the first and second lateral dimensions.

17. The image sensor of claim 16, wherein the first via is formed over a non-bonding pad region of the substrate, and wherein the second via is formed over a bonding pad region of the substrate.

18. The image sensor of claim 17, wherein the bonding pad region of the substrate includes an opening that extends through the front surface of the substrate to the back surface of the substrate;
 and further comprising a bond wire located in the opening and electrically coupled to the second via.

19. The image sensor of claim 16, wherein the second lateral dimension is at least multiple tens of times greater than the first lateral dimension.

20. The image sensor of claim 16, further comprising: a first metal line and a second metal line each embedded in the one or more dielectric layers;
 wherein the first metal line is attached to a first end of the second via, and the second metal line is attached to a second end of the second via, the second end being opposite the first end.

* * * * *